(12) United States Patent
Murakawa et al.

(10) Patent No.: US 12,126,926 B2
(45) Date of Patent: Oct. 22, 2024

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Yusuke Murakawa, Kumamoto (JP); Shin Kitano, Kanagawa (JP); Makoto Nakamura, Kumamoto (JP); Takuya Hanada, Kumamoto (JP); Koya Tsuchimoto, Kumamoto (JP); Yuki Noda, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 105 days.

(21) Appl. No.: 17/794,024

(22) PCT Filed: Jan. 15, 2021

(86) PCT No.: PCT/JP2021/001376
§ 371 (c)(1),
(2) Date: Jul. 20, 2022

(87) PCT Pub. No.: WO2021/153287
PCT Pub. Date: Aug. 5, 2021

(65) Prior Publication Data
US 2023/0033688 A1     Feb. 2, 2023

(30) Foreign Application Priority Data

Jan. 31, 2020    (JP) .................................. 2020-015826

(51) Int. Cl.
*H04N 25/76*     (2023.01)
*H01L 27/146*    (2006.01)
*H04N 25/47*     (2023.01)

(52) U.S. Cl.
CPC ............. *H04N 25/76* (2023.01); *H04N 25/47* (2023.01); *H01L 27/14612* (2013.01)

(58) Field of Classification Search
CPC ...... H04N 25/76; H04N 25/709; H04N 25/47; H04N 25/77; H04N 25/50; H04N 25/75;
(Continued)

(56) References Cited

U.S. PATENT DOCUMENTS

2006/0262209 A1* 11/2006 Kishi ..................... H04N 25/67
                                                     348/297
2015/0194454 A1*  7/2015 Kim .................. H01L 27/14638
                                                     250/208.1
(Continued)

FOREIGN PATENT DOCUMENTS

JP    2016-533140    10/2016
JP    2018-085725     5/2018
(Continued)

OTHER PUBLICATIONS

International Search Report and Written Opinion prepared by the Japan Patent Office on Mar. 25, 2021, for International Application No. PCT/JP2021/001376, 2 pgs.

*Primary Examiner* — Timothy J Henn
(74) *Attorney, Agent, or Firm* — Sheridan Ross PC

(57) ABSTRACT

A solid-state imaging element according to the present disclosure includes a plurality of first photoelectric conversion elements, a plurality of second photoelectric conversion elements, a plurality of current-voltage conversion circuits, and a plurality of address event detection circuits. The first photoelectric conversion elements are arranged side by side
(Continued)

in a first region. The second photoelectric conversion elements are arranged side by side in a second region adjacent to the first region. The current-voltage conversion circuits each convert currents output from the first photoelectric conversion elements or the second photoelectric conversion elements into voltages. The address event detection circuits each detect a change in the voltages output from the current-voltage conversion circuits. At least either the current-voltage conversion circuits or the address event detection circuits connected to the second photoelectric conversion elements prevent output of signals based on the currents output from the second photoelectric conversion elements.

20 Claims, 14 Drawing Sheets

(58) Field of Classification Search
CPC ......... H01L 27/14612; H01L 27/14643; H01L 27/14636; H01L 27/14634
See application file for complete search history.

(56) References Cited

U.S. PATENT DOCUMENTS

| | | |
|---|---|---|
| 2016/0006965 A1 | 1/2016 | Lee |
| 2016/0094787 A1* | 3/2016 | Govil .................. G06V 10/955 348/310 |
| 2018/0146149 A1 | 5/2018 | Suh et al. |
| 2018/0167570 A1* | 6/2018 | Suh ........................ H04N 25/77 |
| 2020/0260032 A1* | 8/2020 | Niwa ..................... H04N 25/79 |
| 2020/0344432 A1* | 10/2020 | Sakakibara ............ H04N 25/00 |
| 2020/0358977 A1* | 11/2020 | Niwa ................... H04N 25/443 |
| 2024/0015412 A1* | 1/2024 | Tsuchimoto ........... H04N 23/12 |

FOREIGN PATENT DOCUMENTS

| | | |
|---|---|---|
| JP | 2019-195135 | 11/2019 |
| WO | WO-2008108926 A1 | 9/2008 |
| WO | WO-2015036592 A1 | 3/2015 |
| WO | WO 2019/087472 | 5/2019 |

\* cited by examiner

SOLID-STATE IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2021/001376, having an international filing date of 15 Jan. 2021, which designated the United States, which PCT application claimed the benefit of Japanese Patent Application No. 2020-015826, filed 31 Jan. 2020, the entire disclosures of each of which are incorporated herein by reference.

TECHNICAL FIELD

The present disclosure relates to a solid-state imaging element and an imaging device.

BACKGROUND ART

In recent years, there has been proposed an asynchronous solid-state imaging element in which an address event detection circuit that detects, for each pixel address, that an amount of light of a pixel thereof exceeds a threshold as an address event in real time is provided in each pixel (see, for example, Patent Document 1).

CITATION LIST

Patent Document

Patent Document 1: Japanese Patent Application Laid-Open No. 2016-533140

SUMMARY OF THE INVENTION

Problems to Be Solved By the Invention

However, in the above-described related art, it is difficult to improve the quality of signals output from effective pixels in the asynchronous solid-state imaging element.

In view of this, the present disclosure proposes a solid-state imaging element and an imaging device capable of improving the quality of signals output from effective pixels.

Solutions to Problems

The present disclosure provides a solid-state imaging element. The solid-state imaging element includes a plurality of first photoelectric conversion elements, a plurality of second photoelectric conversion elements, a plurality of current-voltage conversion circuits, and a plurality of address event detection circuits. The plurality of first photoelectric conversion elements is arranged side by side in a first region. The plurality of second photoelectric conversion elements is arranged side by side in a second region adjacent to the first region. The plurality of current-voltage conversion circuits each converts currents output from the plurality of first photoelectric conversion elements or the plurality of second photoelectric conversion elements into voltages. The plurality of address event detection circuits each detects a change in the voltages output from the plurality of current-voltage conversion circuits. At least either the current-voltage conversion circuits or the address event detection circuits connected to the second photoelectric conversion elements prevent output of signals based on the currents output from the second photoelectric conversion elements.

MODE FOR CARRYING OUT THE INVENTION

Hereinafter, each embodiment of the present disclosure will be described in detail with reference to the drawings.

Note that, in each of the following embodiments, the same parts will be denoted by the same reference signs, and redundant description will be omitted.

A synchronous solid-state imaging element that captures image data (frame) in synchronization with a synchronization signal such as a vertical synchronization signal has been conventionally used in an imaging device or the like. This general synchronous solid-state imaging element can acquire image data only at each period of the synchronization signal (e.g., 1/60 second). Thus, it is difficult to perform higher-speed processing in a case where such processing is required in traffic, robot, and other fields.

In view of this, there has been proposed an asynchronous solid-state imaging element in which an address event detection circuit that detects, for each pixel address, that an amount of light of a pixel thereof exceeds a threshold as an address event in real time is provided in each pixel. In this solid-state imaging element, a photodiode and a plurality of transistors for detecting an address event are arranged in each pixel.

However, in the above-described related art, a power supply voltage to be supplied to effective pixels fluctuates because there is a variation in potential in a region other than an effective pixel region. Thus, the address event detection circuits malfunction in some cases. That is, in the above-described related art, it is difficult to improve the quality of signals output from the effective pixels.

Therefore, it is expected to achieve a technology capable of solving the above-described problems and improving the quality of the signals output from the effective pixels.

[Configuration of Imaging Device]

Figure 1:
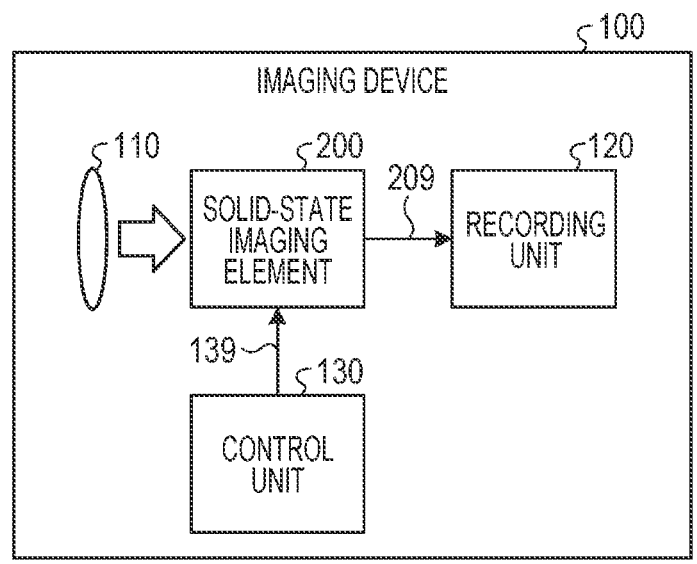
FIG. 1 is a block diagram showing a configuration example of an imaging device according to an embodiment of the present disclosure.

First, a configuration of an imaging device 100 according to an embodiment will be described with reference to FIG. 1. FIG. 1 is a block diagram showing a configuration example of the imaging device 100 according to the embodiment of the present disclosure.

The imaging device 100 according to the embodiment includes an imaging lens 110, a solid-state imaging element 200, a recording unit 120, and a control unit 130. The imaging device 100 is assumed to be a camera mounted on a wearable device, an in-vehicle camera, or the like.

The imaging lens 110 is an example of an optical system and captures incident light from a subject to form an image on an imaging surface of the solid-state imaging element 200.

The solid-state imaging element 200 is also referred to as a dynamic vision sensor (DVS) and detects, for each of a plurality of pixels, that an absolute value of an amount of change in brightness exceeds a threshold as an address event. The address event includes, for example, an on event indicating that an amount of increase in brightness exceeds an upper threshold and an off event indicating that an amount of decrease in brightness falls below a lower threshold less than the upper threshold.

Then, the solid-state imaging element 200 generates, for each pixel, a detection signal indicating a detection result of the address event. Each detection signal includes an on event detection signal $V_{CH}$ (see FIG. 6) indicating presence or absence of the on event and an off event detection signal $V_{CL}$ (see FIG. 6) indicating presence or absence of the off event.

The solid-state imaging element 200 executes predetermined signal processing such as image recognition processing on image data including the detection signals and outputs the processed data to the recording unit 120 via a signal line 209.

The recording unit 120 records the data output from the solid-state imaging element 200. The control unit 130 controls the solid-state imaging element 200 to cause the solid-state imaging element 200 to capture image data.

[Configuration of Solid-State Imaging Element]

Figure 2:
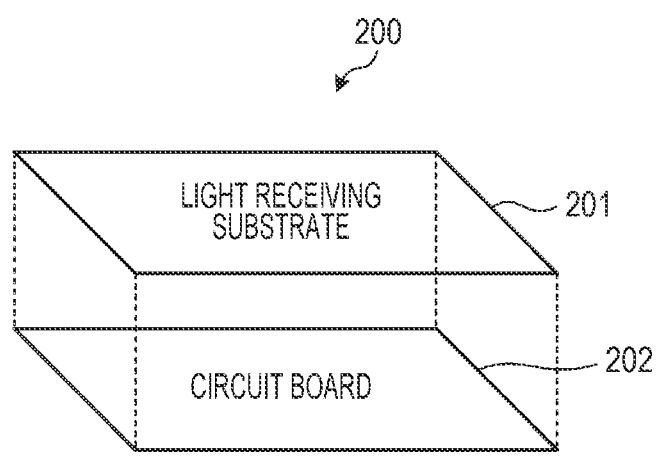
FIG. 2 is an explanatory diagram showing a laminated structure of a solid-state imaging element according to an embodiment of the present disclosure.

Next, a configuration of the solid-state imaging element 200 according to the embodiment will be described with reference to FIGS. 2 to 10. FIG. 2 is an explanatory diagram showing a laminated structure of the solid-state imaging element 200 according to the embodiment of the present disclosure.

The solid-state imaging element 200 according to the embodiment includes a circuit board 202 and a light receiving substrate 201 laminated on the circuit board 202. The light receiving substrate 201 and the circuit board 202 are electrically connected via a connecting portion such as a via, Cu—Cu bonding, or a bump.

Figure 3:
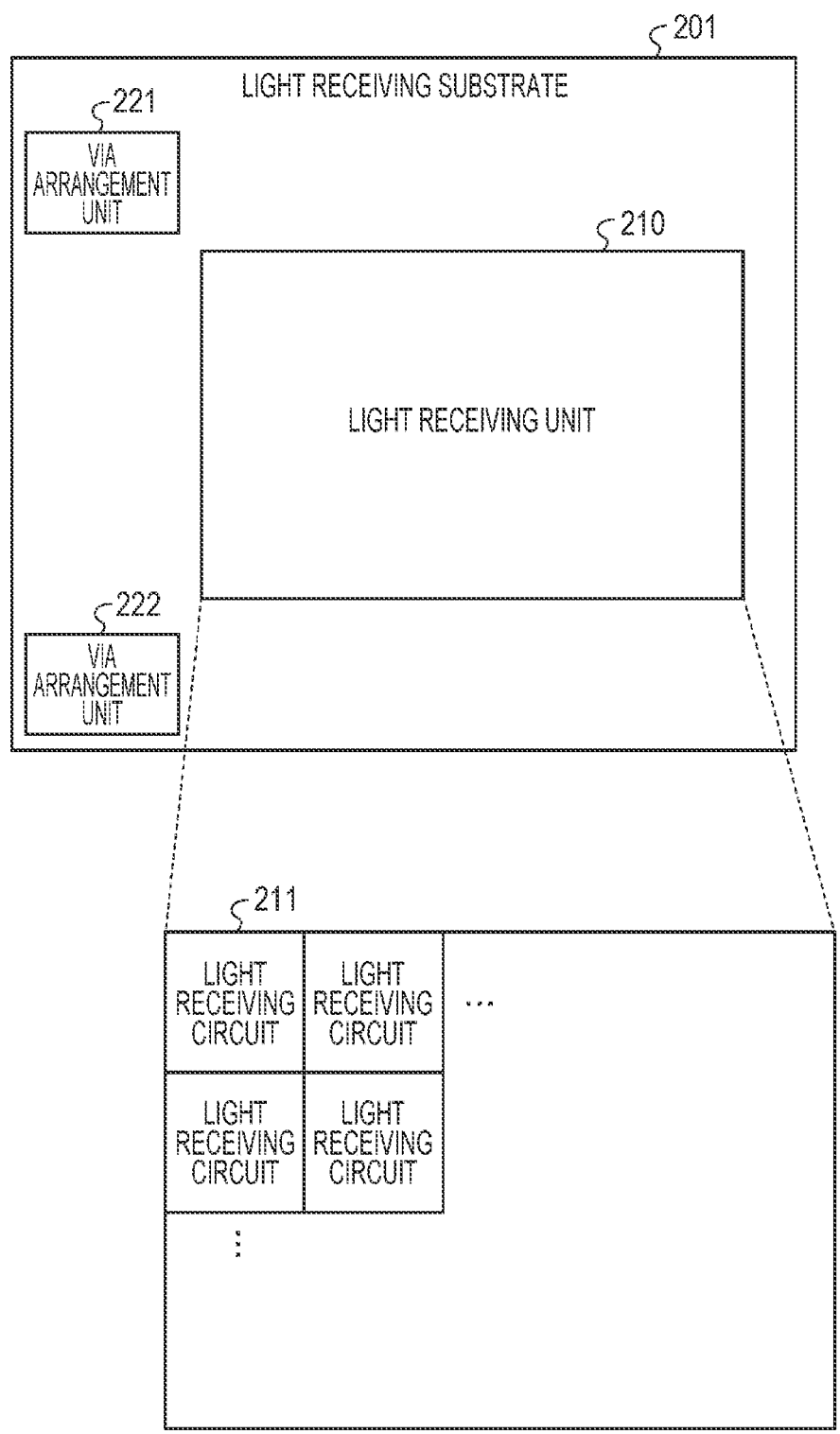
FIG. 3 is an explanatory diagram showing a planar configuration of a light receiving substrate according to an embodiment of the present disclosure.

FIG. 3 is an explanatory diagram showing a planar configuration of the light receiving substrate 201 according to the embodiment of the present disclosure. As shown in FIG. 3, the light receiving substrate 201 includes a light receiving unit 210, a via arrangement portion 221, and a via arrangement portion 222.

In the light receiving unit 210, a plurality of light receiving circuits 211 is arrayed in a two-dimensional lattice pattern. Each of the light receiving circuits 211 photoelectrically converts incident light to generate a photocurrent, performs current-voltage conversion on the photocurrent, and outputs a voltage signal. A pixel address including a row address and a column address is allocated to each of the light receiving circuits 211.

Vias to be connected to the circuit board 202 (see FIG. 4) are arranged in the via arrangement portion 221 and the via arrangement portion 222.

Figure 4:
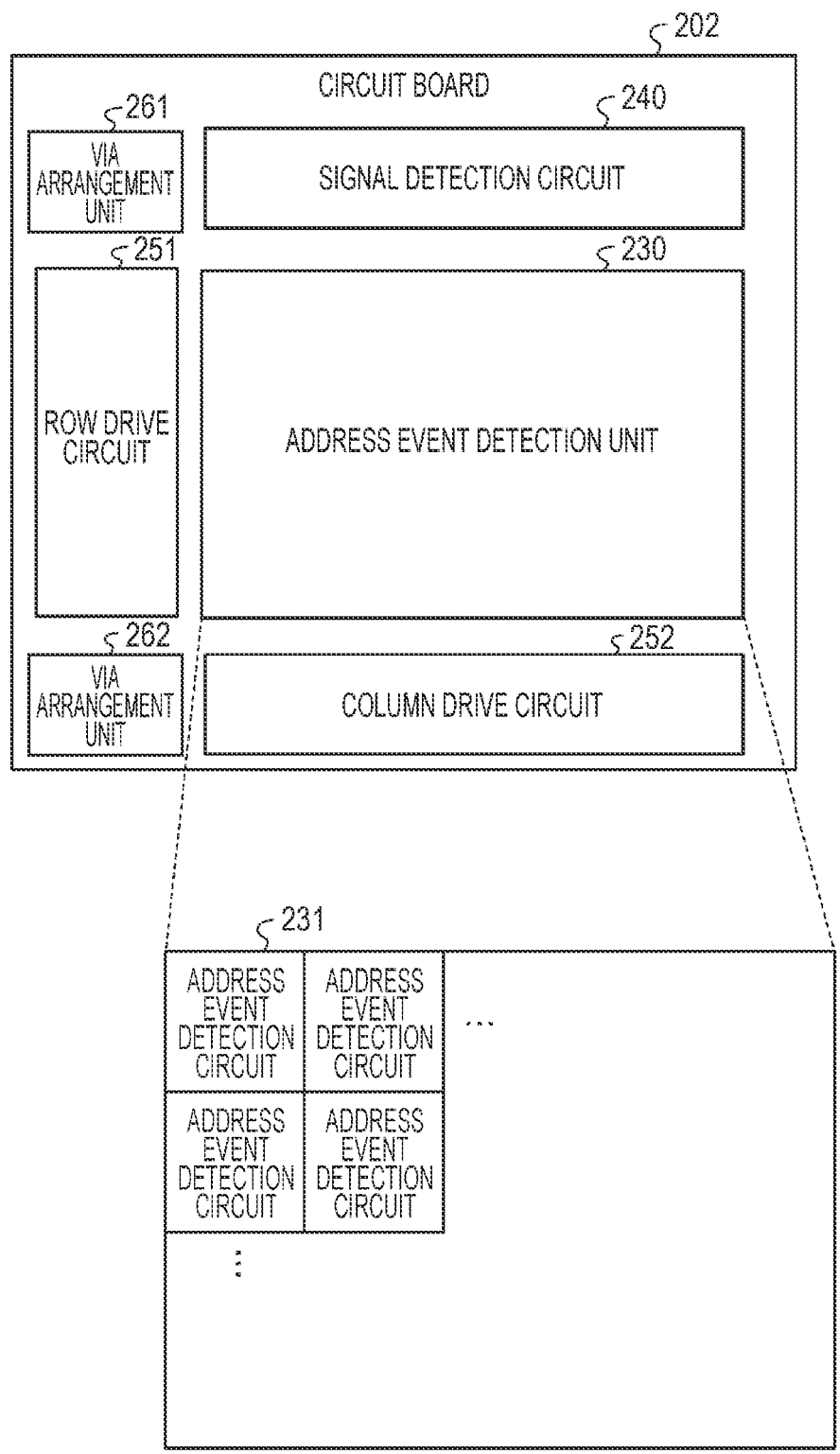
FIG. 4 is an explanatory diagram showing a planar configuration of a circuit board according to an embodiment of the present disclosure.

FIG. 4 is an explanatory diagram showing a planar configuration of the circuit board 202 according to the embodiment of the present disclosure. As shown in FIG. 4, the circuit board 202 includes an address event detection unit 230, a signal processing circuit 240, a row drive circuit 251, a column drive circuit 252, a via arrangement portion 261, and a via arrangement portion 262.

In the address event detection unit 230, a plurality of address event detection circuits 231 is arrayed in the two-dimensional lattice pattern. Each of the address event detection circuits 231 quantizes the voltage signal supplied from the light receiving circuit 211 and outputs the quantized voltage signal as a detection signal.

A pixel address is allocated to each address event detection circuit 231 and is electrically connected to the light receiving circuit 211 having the same address. Further, in the embodiment, the light receiving circuit 211 and the address event detection circuit 231 having the same address are arranged at the same position in plan view.

The signal processing circuit 240 performs predetermined signal processing on the detection signals from the address event detection unit 230. For example, the signal processing circuit 240 arrays the detection signals as pixel signals in the two-dimensional lattice pattern and acquires image data having 2-bit information for each pixel. Then, the signal processing circuit 240 executes signal processing such as image recognition processing on the acquired image data.

The row drive circuit 251 selects a row address and causes the address event detection unit 230 to output detection signals corresponding to the selected row address. The column drive circuit 252 selects a column address and causes the address event detection unit 230 to output detection signals corresponding to the selected column address. Vias to be connected to the light receiving substrate 201 (see FIG. 3) are arranged in the via arrangement portion 261 and the via arrangement portion 262.

Figure 5:
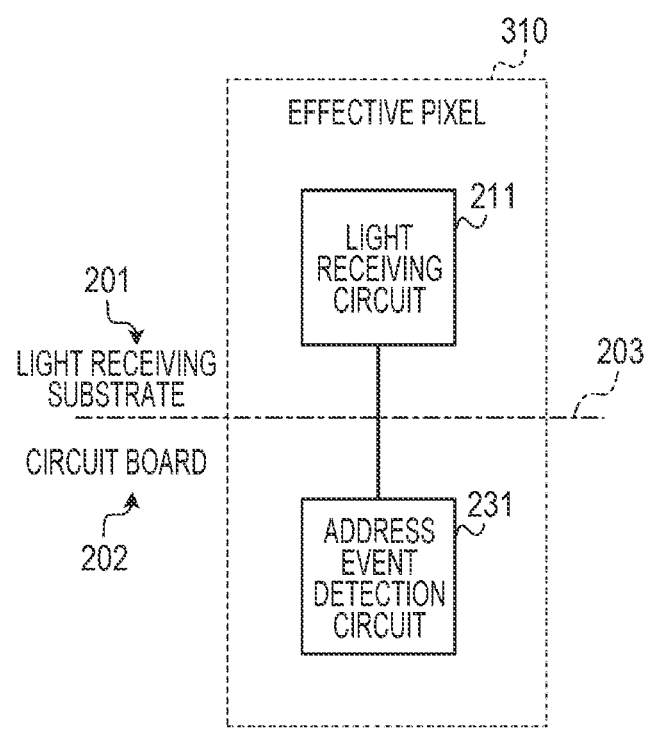
FIG. 5 is an explanatory diagram showing a configuration of an effective pixel according to an embodiment of the present disclosure.

FIG. 5 is an explanatory diagram showing a configuration of an effective pixel 310 according to the embodiment of the present disclosure. As shown in FIG. 5, each effective pixel 310 includes a light receiving circuit 211 in the light receiving substrate 201 and the address event detection circuit 231 in the circuit board 202, to each of which the same pixel address is allocated.

As described above, the plurality of light receiving circuits 211 and the plurality of address event detection circuits 231 are arrayed in the two-dimensional lattice pattern on the light receiving substrate 201 and the circuit board 202. Further, each light receiving circuit 211 and each address event detection circuit 231 having the same address are arranged at the same position in plan view.

That is, in the solid-state imaging element 200 according to the embodiment, the effective pixels 310 each including a pair of the light receiving circuit 211 and the address event detection circuit 231 are arrayed in the two-dimensional lattice pattern. Then, the pair of the light receiving circuit 211 and the address event detection circuit 231 is electrically connected via a connecting portion such as a via, Cu—Cu bonding, or a bump at a bonding portion 203.

Figure 6:
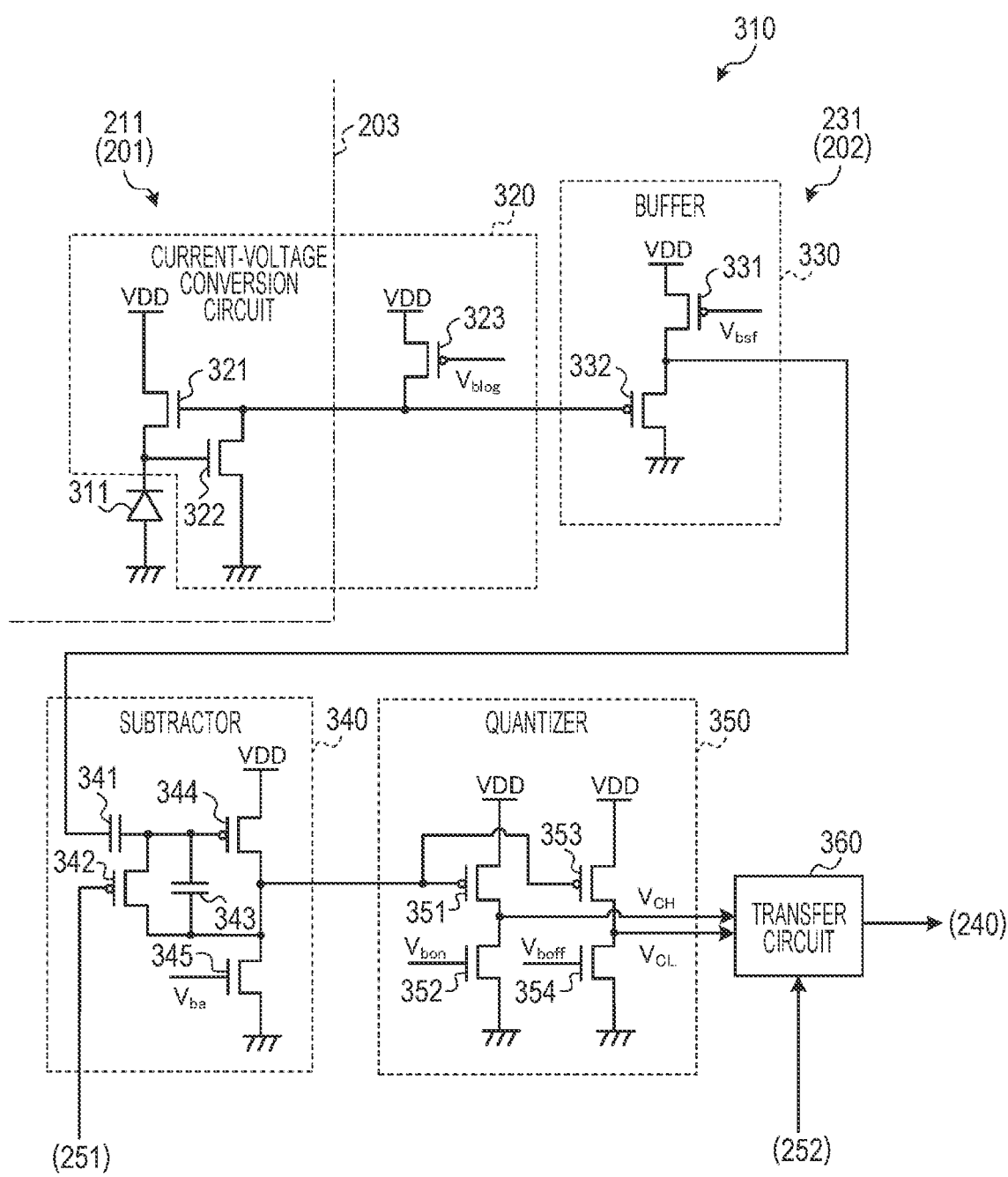
FIG. 6 shows a circuit configuration of an effective pixel according to an embodiment of the present disclosure.

FIG. 6 shows a circuit configuration of the effective pixel 310 according to the embodiment of the present disclosure. As shown in FIG. 6, the effective pixel 310 includes a photodiode 311, a current-voltage conversion circuit 320, a buffer 330, a subtractor 340, a quantizer 350, and a transfer circuit 360.

In the embodiment of the present disclosure, among the units of the effective pixel 310, the photodiode 311 and N-type transistors 321 and 322 of the current-voltage conversion circuit 320 are included in the light receiving circuit 211. Further, among the units of the effective pixel 310, the buffer 330, the subtractor 340, the quantizer 350, and the transfer circuit 360 are included in the address event detection circuit 231.

That is, in the embodiment of the present disclosure, the effective pixel 310 includes the photodiode 311, the current-voltage conversion circuit 320, and the address event detection circuit 231.

The photodiode 311 photoelectrically converts incident light to generate a photocurrent. Then, the photodiode 311 supplies the generated photocurrent to the current-voltage conversion circuit 320.

The current-voltage conversion circuit 320 converts the photocurrent from the photodiode 311 into its logarithmic voltage signal. Then, the current-voltage conversion circuit 320 supplies the converted voltage signal to the buffer 330.

The buffer 330 corrects the voltage signal transmitted from the current-voltage conversion circuit 320 and outputs the corrected signal to the subtractor 340. In the effective pixel 310 according to the embodiment, the buffer 330 can improve driving force for driving the subsequent stage and can secure isolation of noise caused by a switching operation in the subsequent stage.

The subtractor 340 obtains an amount of change in the correction signal transmitted from the buffer 330 by subtraction processing. Then, the subtractor 340 supplies the obtained amount of change to the quantizer 350 as a differential signal.

The quantizer 350 compares the differential signal with a predetermined threshold and thus converts (i.e., quantizes) the analog differential signal into a digital detection signal. The quantizer 350 according to the embodiment compares the differential signal with both the upper threshold and the lower threshold and supplies the comparison results to the transfer circuit 360 as a 2-bit detection signal.

The transfer circuit 360 transfers the detection signal to the signal processing circuit 240 in response to a column drive signal supplied from the column drive circuit 252.

A specific circuit configuration of each unit will be described below. The current-voltage conversion circuit 320 includes the N-type transistor 321, the N-type transistor 322, and a P-type transistor 323. The N-type transistor 321, the N-type transistor 322, and the P-type transistor 323 are, for example, metal-oxide-semiconductor (MOS) transistors.

A source of the N-type transistor 321 is connected to a cathode of the photodiode 311, and a drain thereof is connected to a terminal of a power supply voltage VDD. An anode of the photodiode 311 is connected to a terminal of a ground potential. The P-type transistor 323 and the N-type transistor 322 are connected in series in this order between the terminal of the power supply voltage VDD and the terminal of the ground potential.

A connection point between the P-type transistor 323 and the N-type transistor 322 is connected to a gate of the N-type transistor 321 and an input terminal of the buffer 330. A connection point between the N-type transistor 321 and the photodiode 311 is connected to a gate of the N-type transistor 322. A predetermined bias voltage $V_{blog}$ is applied to a gate of the P-type transistor 323.

Then, the N-type transistor 321 converts a photocurrent generated by the photodiode 311 into a voltage between the gate and the source, and the N-type transistor 322 amplifies the voltage between the gate having a potential corresponding to the photocurrent and the source having a ground potential and outputs the amplified voltage from the drain.

Further, the P-type transistor 323 supplies a constant current based on the bias voltage $V_{blog}$ to the N-type transistor 322. With such a configuration, the current-voltage conversion circuit 320 converts a photocurrent from the photodiode 311 into a voltage signal.

Note that, in the solid-state imaging element 200 according to the embodiment, the photodiode 311, the N-type transistor 321, and the N-type transistor 322 are arranged on the light receiving substrate 201, and circuits subsequent to the P-type transistor 323 are arranged on the circuit board 202.

Figure 7:
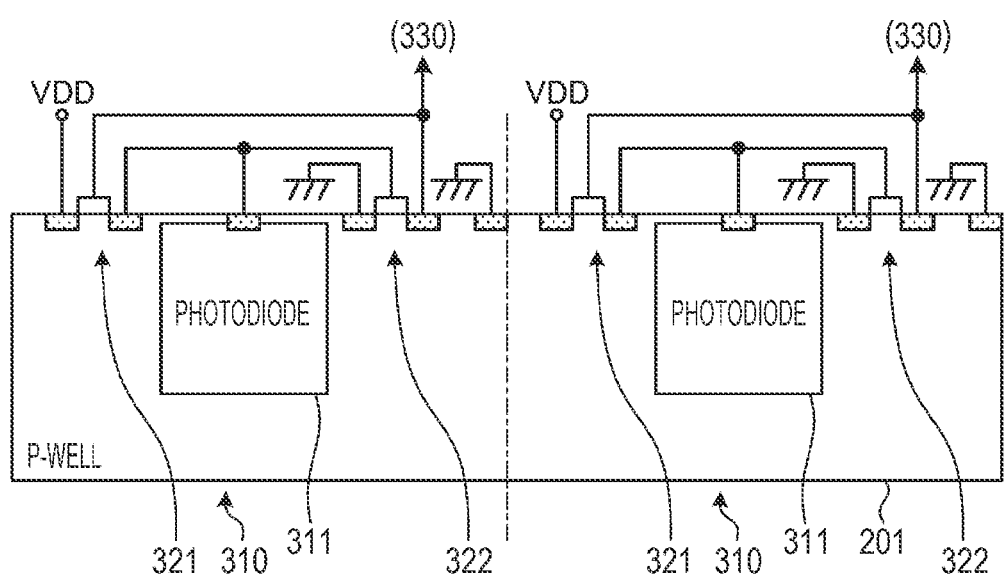
FIG. 7 is an explanatory diagram showing a configuration of an effective pixel according to an embodiment of the present disclosure.

FIG. 7 is an explanatory diagram showing a configuration of the effective pixel 310 according to the embodiment of the present disclosure. As shown in FIG. 7, the photodiode 311 is embedded in a P-well region of the light receiving substrate 201, thereby forming a back gate of the N-type transistor 321 and a back gate of the N-type transistor 322.

The power supply voltage VDD is supplied to the drain of the N-type transistor 321, and a potential of the P-well region (i.e., the anode of the photodiode 311) and a potential of the source of the N-type transistor 322 are the ground potential. Further, the P-well regions of adjacent effective pixels 310 are separated by a pixel separation portion 410 (see FIG. 8) formed in a portion indicated by a one-dot chain line.

The description returns to FIG. 6. The buffer 330 includes a P-type transistor 331 and a P-type transistor 332. The P-type transistor 331 and the P-type transistor 332 are, for example, MOS transistors.

The P-type transistor 331 and the P-type transistor 332 are connected in series in this order between the terminal of the power supply voltage VDD and the terminal of the ground potential. A predetermined bias voltage $V_{bsf}$ is applied to a gate of the P-type transistor 331. A gate of the P-type transistor 332 is connected to an output terminal of the current-voltage conversion circuit 320.

With such a configuration, the buffer 330 outputs the corrected voltage signal from the connection point between the P-type transistor 331 and the P-type transistor 332 to the subtractor 340.

The subtractor 340 includes a capacitor 341, a P-type transistor 342, a capacitor 343, a P-type transistor 344, and an N-type transistor 345. The P-type transistor 342, the P-type transistor 344, and the N-type transistor 345 are, for example, MOS transistors.

The P-type transistor 344 and the N-type transistor 345 are connected in series in this order between the terminal of the power supply voltage VDD and a terminal of a reference potential. A predetermined bias voltage $V_{ba}$ is applied to a gate of the N-type transistor 345.

The P-type transistor 344 and the N-type transistor 345 function as an inverter that inverts and outputs an input signal in a case where a gate of the P-type transistor 344 serves as an input terminal and a connection point between the P-type transistor 344 and the N-type transistor 345 serves as an output terminal.

One end of the capacitor 341 is connected to an output terminal of the buffer 330, and the other end thereof is connected to the input terminal of the inverter (i.e., the gate of the P-type transistor 344). One end of the capacitor 343 is connected to the input terminal of the inverter, and the other end thereof is connected to the output terminal of the inverter (i.e., the connection point between the P-type transistor 344 and the N-type transistor 345).

The P-type transistor 342 opens and closes a path connecting both the ends of the capacitor 343 in response to a row drive signal output from the row drive circuit 251.

When the P-type transistor 342 is turned on, a voltage signal $V_{init}$ is input to the buffer 330 side of the capacitor 341, and an opposite terminal thereof serves as a virtual ground terminal. A potential of the virtual ground terminal is assumed to be zero for convenience.

At this time, charge $Q_{init}$ accumulated in the capacitor 341 is expressed by Expression (1) below, where a capacitance of the capacitor 341 is denoted by C1. Meanwhile, both the ends of the capacitor 343 are short-circuited, and thus accumulated charge thereof becomes zero.

$$Q_{init} = C1 \times V_{init} \qquad (1)$$

Next, considering a case where the P-type transistor 342 is turned off and a voltage on the buffer 330 side of the capacitor 341 changes to $V_{after}$, charge $Q_{after}$ accumulated in the capacitor 341 is expressed by Expression (2) below.

$$Q_{after} = C1 \times V_{after} \qquad (2)$$

Meanwhile, charge Q2 accumulated in the capacitor 343 is expressed by Expression (3) below, where a capacitance of the capacitor 343 is denoted by C2 and an output voltage thereof is denoted by $V_{out}$.

$$Q2 = -C2 \times V_{out} \qquad (3)$$

At this time, the total quantity of charge in the capacitors 341 and 343 do not change, and thus Expression (4) below is established.

$$Q_{init} = Q_{after} + Q2 \qquad (4)$$

Then, when Expressions (1) to (3) are substituted into Expression (4) above and the substituted expression is deformed, Expression (5) below is obtained.

$$V_{out} = -(C1/C2) \times (V_{after} - V_{init}) \qquad (5)$$

Expression (5) above shows an operation of subtracting a voltage signal, and a gain of a result of the subtraction is C1/C2. It is normally desired to maximize the gain, and thus it is preferable to design the capacitance C1 to be large and the capacitance C2 to be small. Meanwhile, when the capacitance C2 is too small, kTC noise increases, and noise characteristics may deteriorate. Therefore, reduction in the capacitance C2 is limited to a range in which noise can be tolerated.

Further, the subtractor 340 is mounted in each effective pixel 310, and thus the capacitance C1 and the capacitance C2 are restricted in area. In view of the above points, for example, the capacitance C1 is set to a value of 20 to 200 femtofarads (fF), and the capacitance C2 is set to a value of 1 to 20 femtofarads (fF).

The quantizer 350 includes a P-type transistor 351, an N-type transistor 352, a P-type transistor 353, and an N-type transistor 354. The P-type transistor 351, the N-type transistor 352, the P-type transistor 353, and the N-type transistor 354 are, for example, MOS transistors.

The P-type transistor 351 and the N-type transistor 352 are connected in series in this order between the terminal of the power supply voltage VDD and the terminal of the ground potential. The P-type transistor 353 and the N-type transistor 354 are connected in series in this order between the terminal of the power supply voltage VDD and a terminal of a reference potential.

Further, a gate of the P-type transistor 351 and a gate of the P-type transistor 353 are connected to an output terminal of the subtractor 340. A bias voltage $V_{bon}$ indicating an upper threshold is applied to a gate of the N-type transistor 352, and a bias voltage $V_{boff}$ indicating a lower threshold is applied to a gate of the N-type transistor 354.

A connection point between the P-type transistor 351 and the N-type transistor 352 is connected to the transfer circuit 360. In the quantizer 350, a voltage at the connection point is output to the transfer circuit 360 as the on event detection signal $V_{CH}$.

A connection point between the P-type transistor 353 and the N-type transistor 354 is connected to the transfer circuit 360. In the quantizer 350, a voltage at the connection point is output as the off event detection signal $V_{CL}$.

With such a configuration, the quantizer 350 outputs a high-level on event detection signal $V_{CH}$ in a case where the differential signal exceeds the upper threshold and outputs a low-level off event detection signal $V_{CL}$ in a case where the differential signal falls below the lower threshold. That is, the solid-state imaging element 200 according to the embodiment can simultaneously detect the presence or absence of both an on event and an off event.

Figure 8:
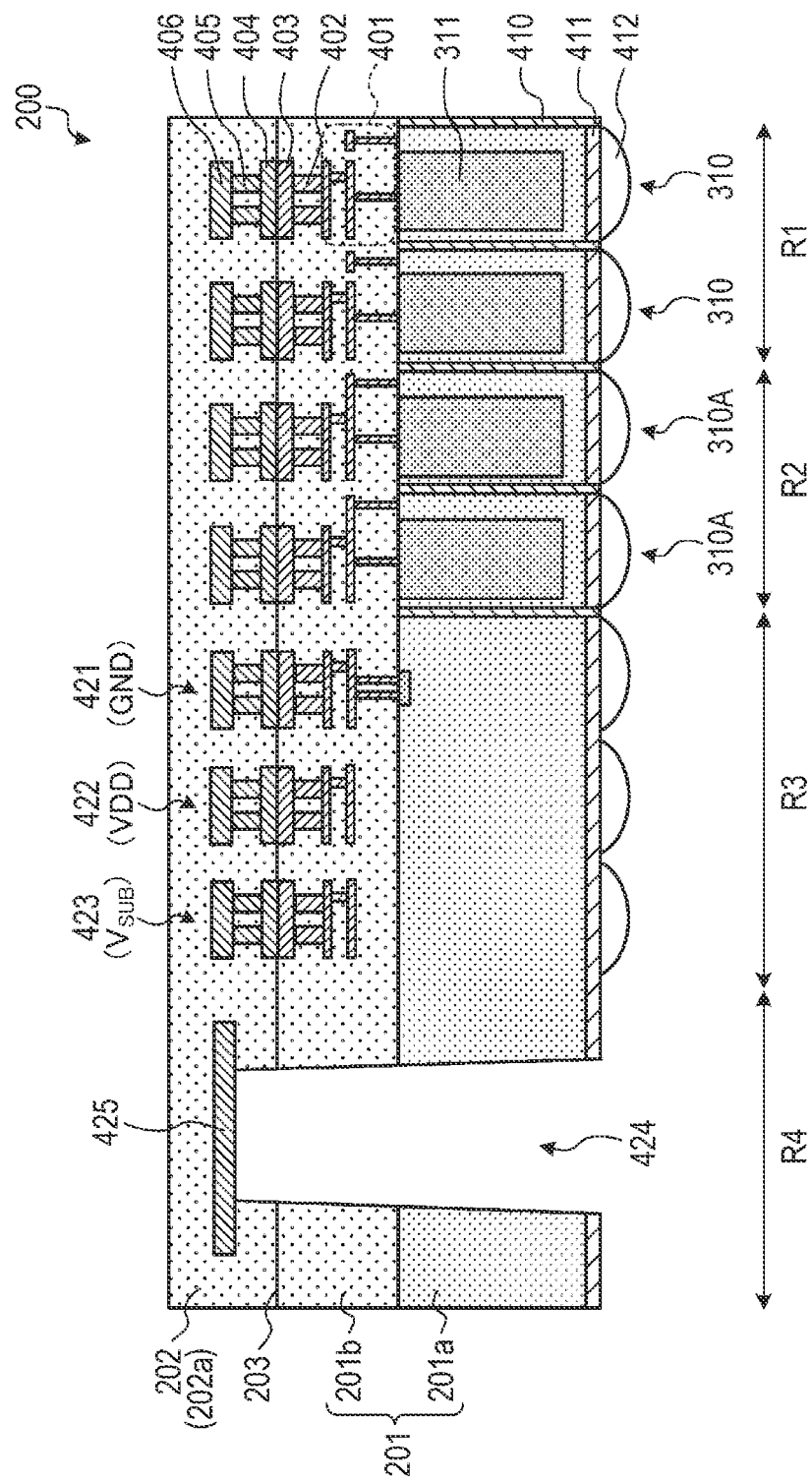
FIG. 8 shows a cross-sectional configuration of a solid-state imaging element according to an embodiment of the present disclosure.

FIG. 8 shows a cross-sectional configuration of the solid-state imaging element 200 according to the embodiment of the present disclosure and mainly shows a cross-sectional structure of a peripheral portion of the solid-state imaging element 200. As shown in FIG. 8, the solid-state imaging element 200 includes an effective pixel region R1, a dummy pixel region R2, a power supply region R3, and a pad region R4. The effective pixel region R1 is an example of a first region, and the dummy pixel region R2 is an example of a second region.

The effective pixel region R1 is a region where the light receiving unit 210 and the address event detection unit 230 thus laminated are provided. In the effective pixel region R1, a plurality of effective pixels 310 is arrayed in the two-dimensional lattice pattern.

Figure 9:
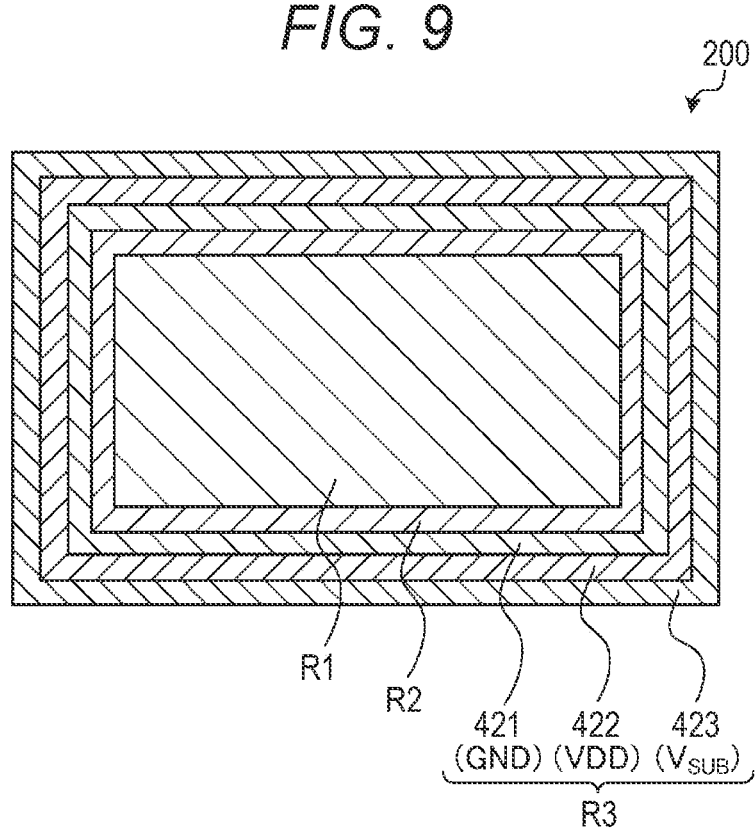
FIG. 9 shows a planar configuration of a solid-state imaging element according to an embodiment of the present disclosure.

As shown in FIG. 9, the dummy pixel region R2 is a region provided to surround four sides of the effective pixel region R1. FIG. 9 shows a planar configuration of the solid-state imaging element 200 according to the embodiment of the present disclosure.

Further, as shown in FIG. 8, a plurality of dummy pixels 310A is arrayed side by side in the dummy pixel region R2. The dummy pixels 310A have the same basic configuration as the effective pixels 310, but do not output a signal to the outside. Details of the dummy pixels 310A will be described later.

Because the dummy pixel region R2 is formed to surround the four sides of the effective pixel region R1 in the solid-state imaging element 200 according to the embodiment, it is possible to secure regularity of a process from the center to an edge of the effective pixel region R1. Therefore, according to the embodiment, it is possible to improve a manufacturing yield of the solid-state imaging element 200.

As shown in FIG. 9, the power supply region R3 is a region provided to surround four sides of the dummy pixel region R2. The power supply region R3 includes ground wiring 421 to which a ground potential is externally applied, power supply wiring 422 to which the power supply voltage VDD is externally applied, and power supply wiring 423 to which a substrate voltage $V_{SUB}$ is externally applied. The ground wiring 421 and the power supply wiring 422 and 423 are formed in, for example, a ring shape around the dummy pixel region R2.

The ground wiring 421 supplies a ground potential to the plurality of effective pixels 310 and the like. The power supply wiring 422 supplies the power supply voltage VDD to the plurality of effective pixels 310 and the like. The power supply wiring 423 supplies the substrate voltage $V_{SUB}$ having the same potential as the power supply voltage VDD to a portion other than the effective pixel region R1 or the dummy pixel region R2 of the solid-state imaging element 200.

The power supply wiring 423 is separately provided from the power supply wiring 422 in the solid-state imaging element 200 according to the embodiment, and thus, even in a case where the power supply voltage VDD fluctuates when, for example, the effective pixels 310 operate, it is possible to supply the stable substrate voltage $V_{SUB}$ to the peripheral portion of the solid-state imaging element 200. Therefore, according to the embodiment, it is possible to stably operate the solid-state imaging element 200.

The description returns to FIG. 8. The pad region R4 is a region provided around the power supply region R3 and includes a contact hole 424 and a bonding pad 425. The contact hole 424 is formed from a surface on a light incident side of the light receiving substrate 201 to the middle of the circuit board 202 along a thickness direction of the light receiving substrate 201 and the circuit board 202.

The bonding pad 425 is provided at the bottom of the contact hole 424. In the embodiment, a bonding wire or the like is bonded to the bonding pad 425 via the contact hole 424, and thus the recording unit 120 (see FIG. 1) or the control unit 130 (see FIG. 1) is electrically connected to each unit of the solid-state imaging element 200.

The configuration of each of the effective pixels 310 arranged in the effective pixel region R1 will be further described with reference to FIG. 8. The solid-state imaging element 200 is formed by laminating the light receiving substrate 201 and the circuit board 202, and the bonding portion 203 is provided at an interface between the light receiving substrate 201 and the circuit board 202.

The light receiving substrate 201 includes a semiconductor layer 201a and an insulating layer 201b. The semiconductor layer 201a is made from a semiconductor material such as silicon. In the semiconductor layer 201a, the photodiode 311, the N-type transistor 321 (see FIG. 7), the N-type transistor 322 (see FIG. 7), and the like are formed in each of the effective pixels 310 and the dummy pixels 310A.

Further, in the semiconductor layer 201a, the pixel separation portion 410 is formed to separate adjacent effective pixels 310 or dummy pixels 310A from each other. The pixel separation portion 410 electrically and optically separates the adjacent effective pixels 310 or dummy pixels 310A from each other.

For example, the pixel separation portion 410 is formed to individually surround the effective pixels 310 or the dummy pixels 310A and penetrate the semiconductor layer 201a.

A planarizing film 411 is formed on a surface on a light incident side of the semiconductor layer 201a, and on-chip lenses 412 are formed on a surface on a light incident side of the planarizing film 411. The planarizing film 411 planarizes a surface on which the on-chip lenses 412 are mounted.

For example, the on-chip lenses 412 are individually provided in the effective pixels 310 and the dummy pixels 310A, collect incident light, and guides the incident light to the effective pixels 310 and the dummy pixels 310A.

The insulating layer 201b is made from an insulating material such as silicon oxide ($SiO_x$), silicon nitride (SiN), or silicon oxynitride (SiON), and is provided on a surface of the semiconductor layer 201a facing the surface on the light incident side thereof.

Further, a wiring portion 401 including a wiring layer, a via, and the like is formed in the insulating layer 201b. The wiring portion 401 is electrically connected to the photodiode 311, the N-type transistor 321, and the N-type transistor 322 provided in the semiconductor layer 201a with the wiring configuration of FIG. 6.

The wiring portion 401 is electrically connected to a first pad 403 via a via 402. The first pad 403 is provided to be exposed on a surface of the light receiving substrate 201 facing the surface on the light incident side thereof (i.e., the interface with the circuit board 202) and is made from copper or a copper alloy.

The circuit board 202 has an insulating layer 202a at the interface with the light receiving substrate 201. The insulating layer 202a is made from an insulating material such as silicon oxide, silicon nitride, or silicon oxynitride.

Further, the insulating layer 202a includes a second pad 404. The second pad 404 is provided to be exposed on a surface on a light incident side of the circuit board 202 (i.e., the interface with the light receiving substrate 201) and is made from copper or a copper alloy.

The second pad 404 is electrically connected to a wiring portion 406 via a via 405. The wiring portion 406 is electrically connected to the gate of the P-type transistor 332 (see FIG. 6) and a source of the P-type transistor 323 (see FIG. 6). Further, in the embodiment, the first pad 403 and the second pad 404 are directly bonded by Cu—Cu bonding.

Figure 10:
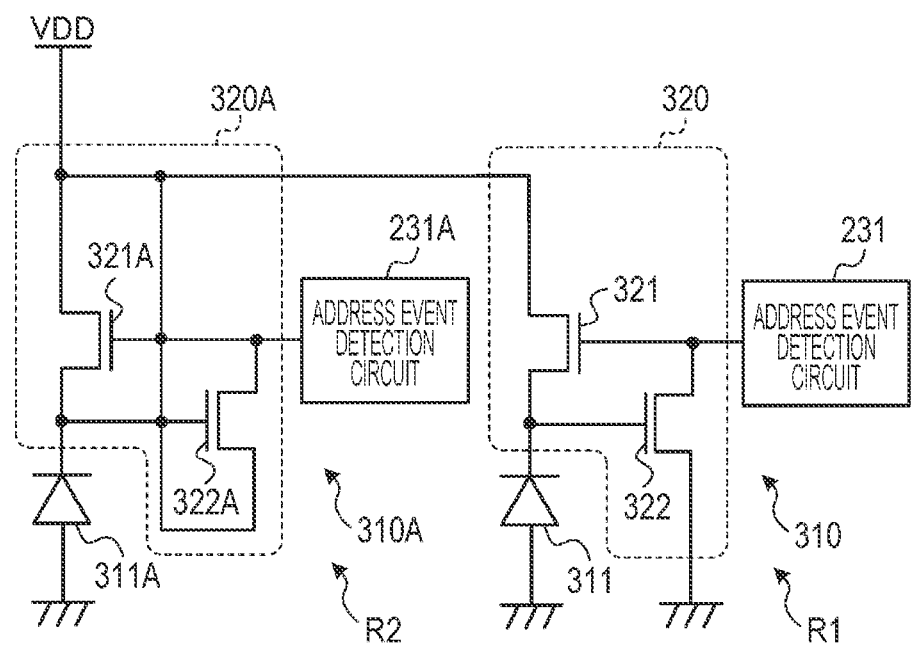
FIG. 10 shows a circuit configuration of an effective pixel and a dummy pixel according to an embodiment of the present disclosure.

FIG. 10 shows a circuit configuration of the effective pixel 310 and the dummy pixel 310A according to the embodiment of the present disclosure.

As described above, in each of the effective pixels 310 arranged in the effective pixel region R1, a photocurrent generated by the photodiode 311 is converted into a voltage signal by the current-voltage conversion circuit 320, and the voltage signal is output to the address event detection circuit 231. The photodiode 311 arranged in the effective pixel region R1 is an example of a first photoelectric conversion element.

Meanwhile, in each of the dummy pixels 310A arranged in the dummy pixel region R2, address event detection signals (on event detection signal $V_{CH}$ and off event detection signal $V_{CL}$) based on a photocurrent generated by a photodiode 311A are prevented from being output. The photodiode 311A arranged in the dummy pixel region R2 is an example of a second photoelectric conversion element.

For example, as shown in FIG. 10, in a current-voltage conversion circuit 320A belonging to the dummy pixel 310A, all terminals of an N-type transistor 321A and an N-type transistor 322A are short-circuited, and a potential of each terminal is fixed to the power supply voltage VDD.

Here, the N-type transistor 321A of the current-voltage conversion circuit 320A is a transistor corresponding to the N-type transistor 321 of the current-voltage conversion circuit 320. Further, the N-type transistor 322A of the current-voltage conversion circuit 320A is a transistor corresponding to the N-type transistor 322 of the current-voltage conversion circuit 320.

Further, each terminal of the N-type transistors 321A and 322A is, for example, short-circuited by metal wiring in a first layer formed in the insulating layer 201b as shown in FIG. 8.

Because the potential of each terminal of the N-type transistors 321A and 322A is fixed as described above, the current-voltage conversion circuit 320A belonging to the dummy pixel 310A can prevent output of the address event detection signals based on the photocurrent supplied from the photodiode 311A.

Further, because the output of the address event detection signals from the dummy pixel 310A is prevented in the embodiment, it is possible to prevent the power supply voltage VDD from fluctuating due to operation of the dummy pixel 310A.

Therefore, the fluctuation of the power supply voltage VDD to be supplied to the quantizer 350 (see FIG. 6) of the effective pixel 310 is prevented, and thus it is possible to prevent the quantizer 350 from malfunctioning due to the fluctuation of the power supply voltage VDD and prevent erroneous address event detection signals from being output.

Therefore, according to the embodiment, it is possible to improve the quality of the address event detection signals output from the effective pixel 310.

Note that, in the embodiment, means for fixing the potential of the current-voltage conversion circuit 320A belonging to the dummy pixel 310A is not limited to supply of the power supply voltage VDD to each terminal of the N-type transistors 321A and 322A.

For example, the potential of the current-voltage conversion circuit 320A may be fixed by supplying a predetermined voltage to each terminal of the N-type transistors 321A and 322A from an external power supply (not shown).

Also with this configuration, the fluctuation of the power supply voltage VDD to be supplied to the quantizer 350 of the effective pixel 310 is prevented, and thus it is possible to prevent the quantizer 350 from malfunctioning due to the fluctuation of the power supply voltage VDD and prevent erroneous address event detection signals from being output.

Therefore, according to the embodiment, it is possible to improve the quality of the address event detection signals output from the effective pixel 310.

Further, in the embodiment, means for preventing the output of the address event detection signals based on the photocurrent supplied from the photodiode 311A is not limited to the fixation of the potential of the current-voltage conversion circuit 320A.

For example, the output of the address event detection signals based on the photocurrent supplied from the photodiode 311A may be prevented by fixing a potential of the address event detection circuit 231A belonging to the dummy pixel 310A.

Also with this configuration, the fluctuation of the power supply voltage VDD to be supplied to the quantizer 350 of the effective pixel 310 is prevented, and thus it is possible to prevent the quantizer 350 from malfunctioning due to the fluctuation of the power supply voltage VDD and prevent erroneous address event detection signals from being output.

Therefore, according to the embodiment, it is possible to improve the quality of the address event detection signals output from the effective pixel 310.

Further, in the embodiment, the output of the address event detection signals based on the photocurrent supplied from the photodiode 311A may be prevented by fixing both the potential of the current-voltage conversion circuit 320A and the potential of the address event detection circuit 231A.

Further, in the embodiment, the output of the address event detection signals based on the photocurrent supplied from the photodiode 311A may be prevented by other means than fixing the potential of the current-voltage conversion circuit 320A or the address event detection circuit 231A.

Further, in the embodiment, a potential of the power supply region R3 may be fixed. For example, in the embodiment, as shown in FIG. 8, the potential of the power supply region R3 can be fixed by electrically connecting the semiconductor layer 201a and the ground wiring 421 located in the power supply region R3.

Then, in the embodiment, when the potential of the power supply region R3 is fixed, it is possible to prevent fluctuation in a potential of the power supply wiring 422 (i.e., the power supply voltage VDD) located in the power supply region R3.

Therefore, the fluctuation of the power supply voltage VDD to be supplied to the quantizer 350 of the effective pixel 310 is prevented, and thus it is possible to prevent the quantizer 350 from malfunctioning due to the fluctuation of the power supply voltage VDD and prevent erroneous address event detection signals from being output.

Therefore, according to the embodiment, it is possible to improve the quality of the address event detection signals output from the effective pixel 310. Note that the potential of the power supply region R3 is not limited to the fixation to the ground potential and may be fixed by a power supply voltage, an external power supply, or the like.

Further, in the embodiment, the inside of the power supply region R3 is preferably not separated by the pixel separation portion 410. That is, in the embodiment, it is preferable that the power supply region R3 be electrically integrated.

Therefore, the potential of the entire power supply region R3 can be easily fixed. Hence, according to the embodiment, it is possible to easily prevent the fluctuation in the potential of the power supply wiring 422 located in the power supply region R3.

Various Modification Examples

Figure 11:
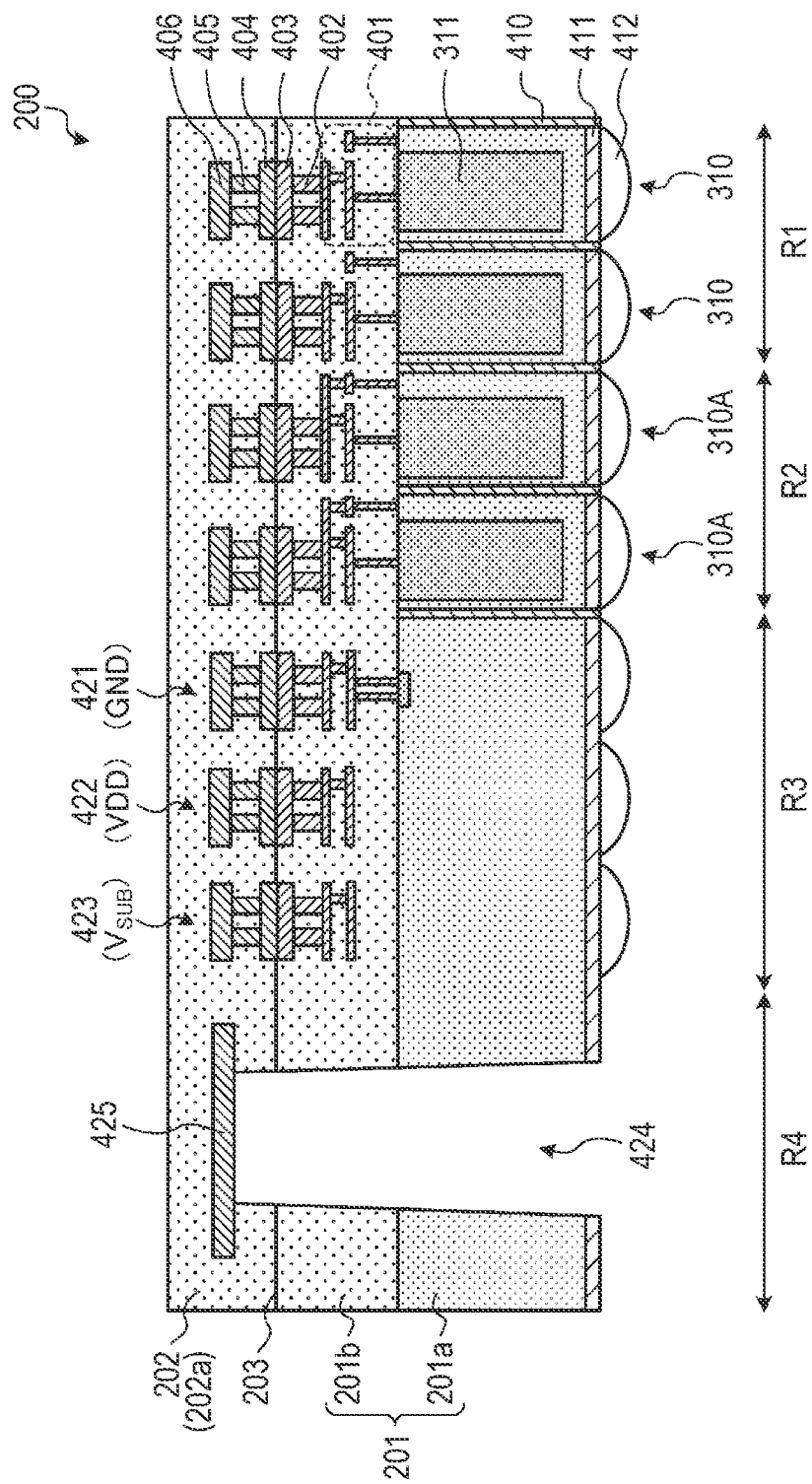
FIG. 11 shows a cross-sectional configuration of a solid-state imaging element according to Modification Example 1 of an embodiment of the present disclosure.

Next, various modification examples of the embodiment will be described with reference to FIGS. 11 to 15. FIG. 11 shows a cross-sectional configuration of the solid-state imaging element 200 according to Modification Example 1 of the embodiment of the present disclosure, which corresponds to FIG. 8 of the embodiment.

As shown in FIG. 11, each terminal of the N-type transistors 321A (see FIG. 10) and 322A (see FIG. 10) provided in the dummy pixel 310A may be short-circuited by metal wiring in a second layer formed in the insulating layer 201b.

Figure 12:
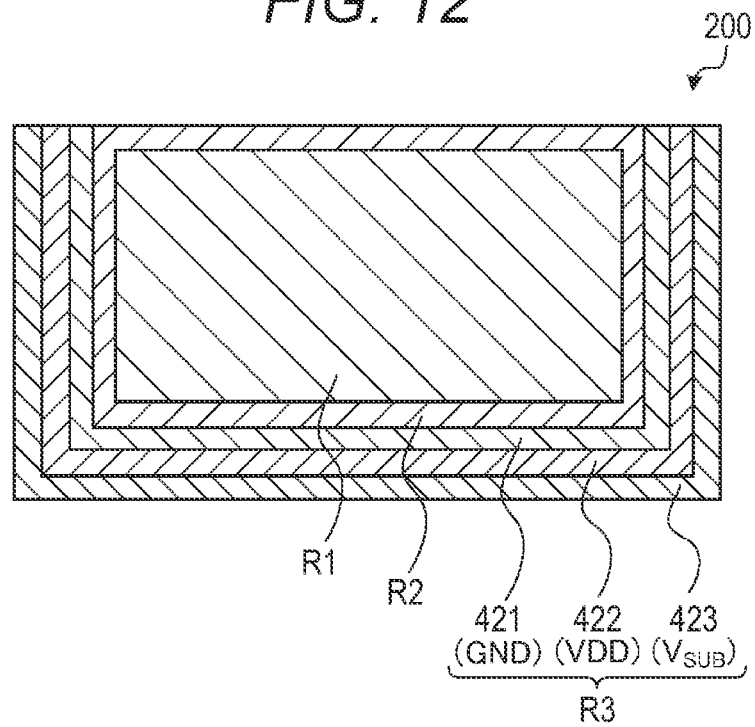
FIG. 12 shows a planar configuration of a solid-state imaging element according to Modification Example 2 of an embodiment of the present disclosure.

FIG. 12 shows a planar configuration of the solid-state imaging element 200 according to Modification Example 2 of the embodiment of the present disclosure, which corresponds to FIG. 9 of the embodiment. As shown in FIG. 12, in Modification Example 2, the dummy pixel region R2 is provided to surround the four sides of the effective pixel region R1, and the power supply region R3 is provided to surround three sides of the dummy pixel region R2.

Figure 13:
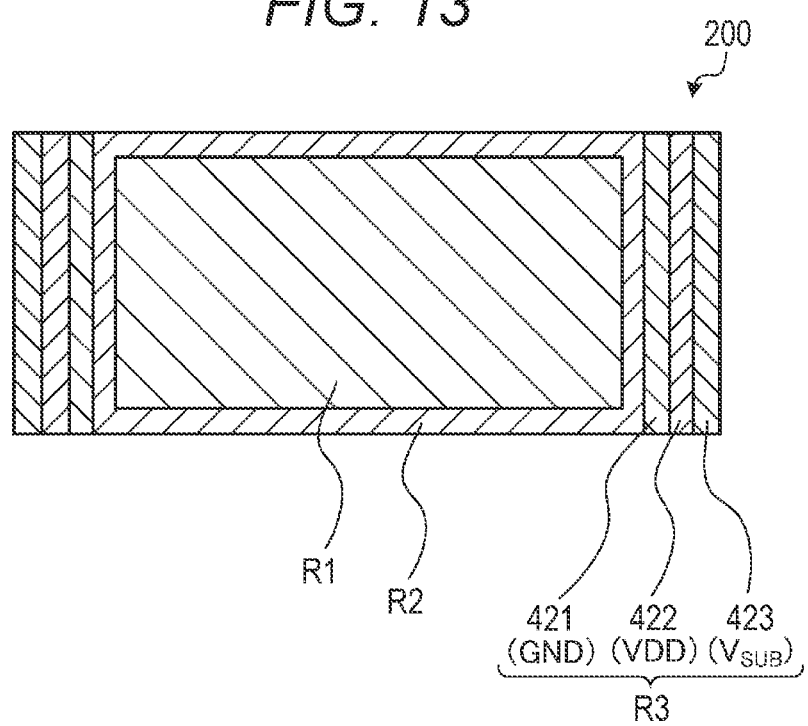
FIG. 13 shows a planar configuration of a solid-state imaging element according to Modification Example 3 of an embodiment of the present disclosure.

FIG. 13 shows a planar configuration of the solid-state imaging element 200 according to Modification Example 3 of the embodiment of the present disclosure. As shown in FIG. 13, in Modification Example 3, the dummy pixel region R2 is provided to surround the four sides of the effective pixel region R1, and the power supply region R3 is provided along two sides of the dummy pixel region R2.

Figure 14:
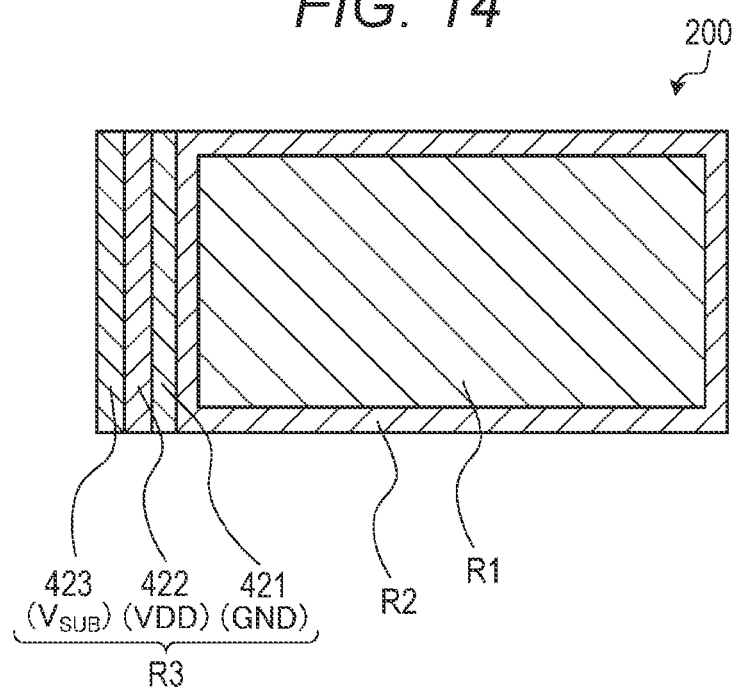
FIG. 14 shows a planar configuration of a solid-state imaging element according to Modification Example 4 of an embodiment of the present disclosure.

FIG. 14 shows a planar configuration of the solid-state imaging element 200 according to Modification Example 4 of the embodiment of the present disclosure. As shown in FIG. 14, in Modification Example 4, the dummy pixel region R2 is provided to surround the four sides of the effective pixel region R1, and the power supply region R3 is provided along one side of the dummy pixel region R2.

Figure 15:
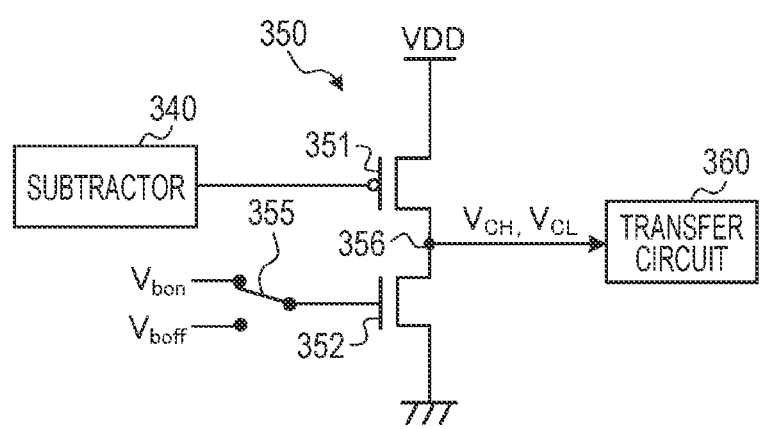
FIG. 15 shows a circuit configuration of an effective pixel according to Modification Example 5 of an embodiment of the present disclosure.

FIG. 15 shows a circuit configuration of the effective pixel 310 according to Modification Example 5 of the embodiment of the present disclosure and shows the quantizer 350 that detects the presence or absence of any one of a selected on event and off event.

The quantizer 350 according to Modification Example 5 includes the P-type transistor 351, the N-type transistor 352, and a switch 355. The P-type transistor 351 and the N-type transistor 352 are connected in series in this order between the terminal of the power supply voltage VDD and the terminal of the ground potential.

Further, the gate of the P-type transistor 351 is connected to the output terminal of the subtractor 340. The gate of the N-type transistor 352 is connected to the switch 355.

Then, the control unit 130 turns on or off the switch 355, thereby applying the bias voltage $V_{bon}$ indicating the upper threshold or the bias voltage $V_{boff}$ indicating the lower threshold to the gate of the N-type transistor 352. A connection point 356 between the P-type transistor 351 and the N-type transistor 352 is connected to the transfer circuit 360.

Then, in a case where the bias voltage $V_{bon}$ is applied to the gate of the N-type transistor 352, in the quantizer 350 according to Modification Example 5, a voltage of the connection point 356 is output to the transfer circuit 360 as the on event detection signal $V_{CH}$.

Meanwhile, in a case where the bias voltage $V_{boff}$ is applied to the gate of the N-type transistor 352, in the quantizer 350 according to Modification Example 5, the voltage of the connection point 356 is output to the transfer circuit 360 as the off event detection signal $V_{CL}$.

With such a configuration, in a case where the on event is selected by the control unit 130 and the differential signal exceeds the upper threshold, the quantizer 350 according to Modification Example 5 outputs the high-level on event detection signal $V_{CH}$.

Meanwhile, in a case where the off event is selected by the control unit 130 and the differential signal exceeds falls below the lower threshold, the quantizer 350 according to Modification Example 5 outputs the low-level off event detection signal $V_{CL}$.

For example, in the solid-state imaging element 200 according to Modification Example 5, in order to turn on a light source (not shown) in response to a command from the control unit 130 or the like, the control unit 130 selects the on event and therefore can efficiently output the on event detection signal $V_{CL}$.

Further, in the solid-state imaging element 200 according to Modification Example 5, in order to turn off the light source (not shown) in response to a command from the control unit 130 or the like, the control unit 130 selects the off event and therefore can efficiently output the off event detection signal $V_{CL}$.

In Modification Example 5 described above, it is possible to reduce the number of transistors included in the quantizer 350. This makes it possible to reduce a chip area of the solid-state imaging element 200 and also reduce power consumption of the solid-state imaging element 200.

[Effects]

The solid-state imaging element 200 according to the embodiment includes a plurality of first photoelectric conversion elements (photodiodes 311), a plurality of second photoelectric conversion elements (photodiodes 311A), a plurality of current-voltage conversion circuits 320 and 320A, and a plurality of address event detection circuits 231 and 231A. The plurality of first photoelectric conversion elements (photodiodes 311) is arranged side by side in a first region (effective pixel region R1). The plurality of second photoelectric conversion elements (photodiodes 311A) is arranged side by side in a second region (dummy pixel region R2) adjacent to the first region (effective pixel region R1). The plurality of current-voltage conversion circuits 320 and 320A each converts currents output from the plurality of first photoelectric conversion elements (photodiodes 311) and the plurality of second photoelectric conversion elements (photodiodes 311A) into voltages. The plurality of address event detection circuits 231 and 231A each detects a change in the voltages output from the plurality of current-voltage conversion circuits 320 and 320A. At least either the current-voltage conversion circuits 320A or the address event detection circuits 231A connected to the second photoelectric conversion elements (photodiodes 311A) prevent output of signals based on the currents output from the second photoelectric conversion elements.

Therefore, it is possible to improve the quality of address event detection signals output from the effective pixels 310.

Further, in the solid-state imaging element 200 according to the embodiment, the second region (dummy pixel region R2) is provided to surround the first region (effective pixel region R1).

Therefore, it is possible to improve the manufacturing yield of the solid-state imaging element 200.

Further, in the solid-state imaging element 200 according to the embodiment, internal potentials of at least either the current-voltage conversion circuits 320A or the address event detection circuits 231A connected to the second photoelectric conversion elements (photodiodes 311A) are fixed.

Therefore, it is possible to prevent output of address event detection signals based on photocurrents output from the photodiodes 311A.

Further, in the solid-state imaging element 200 according to the embodiment, each of the current-voltage conversion circuits 320A connected to the second photoelectric conversion elements (photodiodes 311A) includes a plurality of transistors (N-type transistors 321A and 322A). Then, by short-circuiting the plurality of transistors (N-type transistors 321A and 322A), potentials in the current-voltage conversion circuits 320A connected to the second photoelectric conversion elements (photodiodes 311A) are fixed.

Therefore, it is possible to prevent output of address event detection signals based on photocurrents output from the photodiodes 311A.

Further, in the solid-state imaging element 200 according to the embodiment, internal potentials of at least either the current-voltage conversion circuits 320A or the address event detection circuits 231A connected to the second photoelectric conversion elements (photodiodes 311A) are fixed by an external voltage.

Therefore, it is possible to prevent output of address event detection signals based on photocurrents output from the photodiodes 311A.

Further, the solid-state imaging element 200 according to the embodiment further includes the power supply region R3 provided outside the second region (dummy pixel region R2) and having the power supply wiring 422 and 423 and the ground wiring 421.

Therefore, it is possible to improve the quality of address event detection signals output from the effective pixels 310.

Further, in the solid-state imaging element 200 according to the embodiment, an internal potential of the power supply region R3 is fixed.

Therefore, it is possible to prevent the fluctuation in the potential of the power supply wiring 422 (i.e., the power supply voltage VDD) located in the power supply region R3.

Further, in the solid-state imaging element 200 according to the embodiment, the power supply region R3 is electrically integrated.

Therefore, it is possible to easily prevent the fluctuation in the potential of the power supply wiring 422 located in the power supply region R3.

[Second Configuration Example of Address Event Detection Unit]

Figure 16:
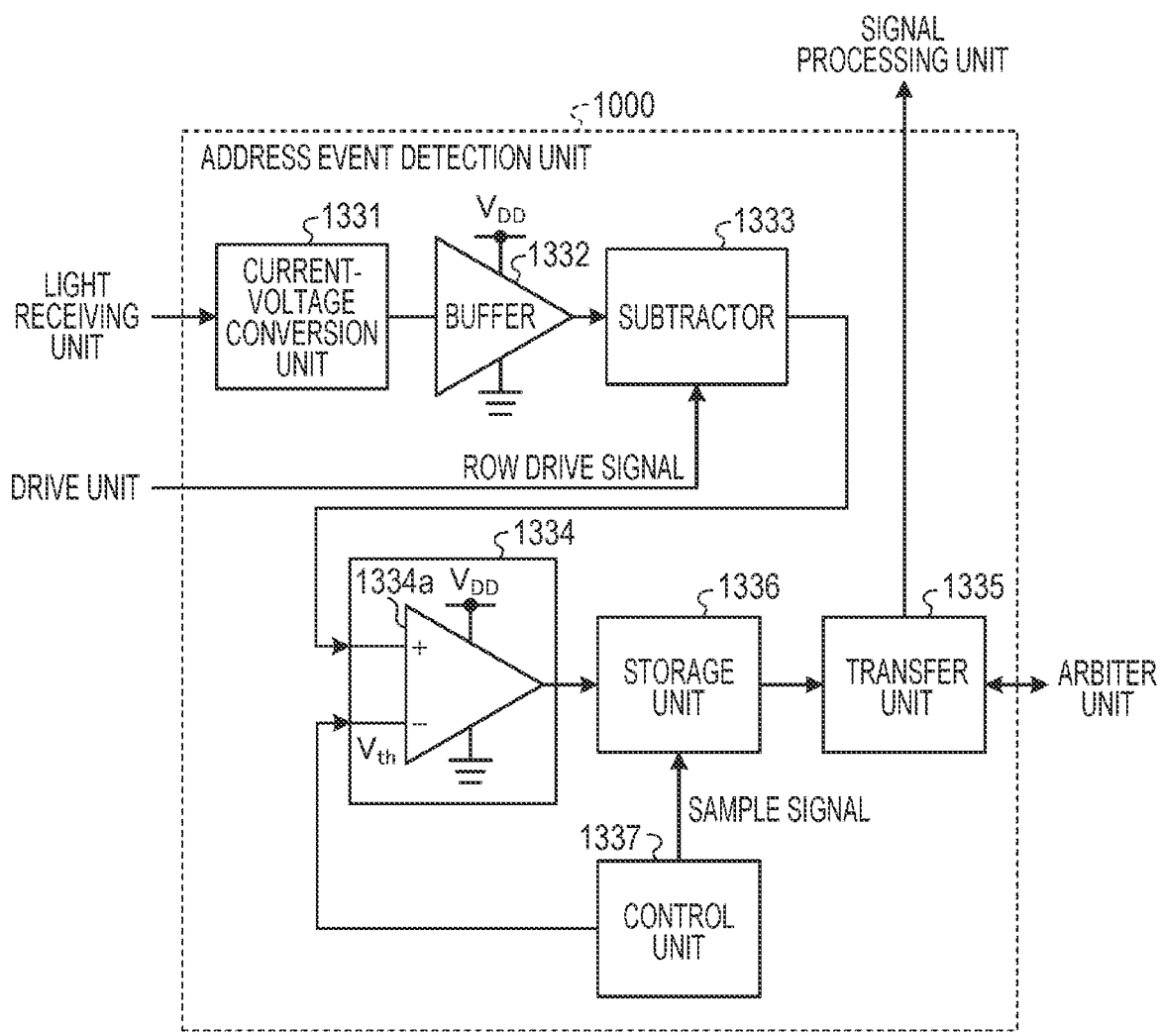
FIG. 16 is a block diagram showing a second configuration example of an address event detection unit.

FIG. 16 is a block diagram showing a second configuration example of an address event detection unit 1000. As shown in FIG. 16, the address event detection unit 1000 according to this configuration example includes not only a current-voltage conversion unit 1331, a buffer 1332, a subtractor 1333, a quantizer 1334, and a transfer unit 1335 but also a storage unit 1336 and a control unit 1337.

The storage unit 1336 is provided between the quantizer 1334 and the transfer unit 1335 and accumulates output of the quantizer 1334, that is, a result of comparison by a comparator 1334a on the basis of a sample signal supplied from the control unit 1337. The storage unit 1336 may be a sampling circuit such as a switch, plastic, or a capacitor or may be a digital memory circuit such as a latch or a flip-flop.

The control unit 1337 supplies a predetermined threshold voltage Vth to an inverted (−) input terminal of the comparator 1334a. The threshold voltage Vth supplied from the control unit 1337 to the comparator 1334a may have different voltage values in a time division manner. For example, the control unit 1337 supplies, at different timings, a threshold voltage Vth1 corresponding to an on event indicating that an amount of change of a photocurrent exceeds an upper threshold and a threshold voltage Vth2 corresponding to an off event indicating that the amount of change thereof falls below a lower threshold, and therefore one comparator 1334a can detect a plurality of types of address events.

For example, the storage unit 1336 may accumulate the result of comparison by the comparator 1334a using the threshold voltage Vth1 corresponding to the on event in a period in which the threshold voltage Vth2 corresponding to the off event is supplied from the control unit 1337 to the inverted (−) input terminal of the comparator 1334a. Note that the storage unit 1336 may be inside a pixel 2030 (see FIG. 17) or outside the pixel 2030. Further, the storage unit 1336 is not an essential component of the address event detection unit 1000. That is, the storage unit 1336 may not be provided.

[Imaging Device (Scanning Method) According to Second Configuration Example]

The imaging device 100 according to the first configuration example described above is an asynchronous imaging device that reads an event by an asynchronous reading method. However, the event reading method is not limited to the asynchronous reading method and may be a synchronous reading method. The imaging device to which the synchronous reading method is applied is an imaging device of a scanning method, which is the same as a normal imaging device that performs imaging at a predetermined frame rate.

Figure 17:
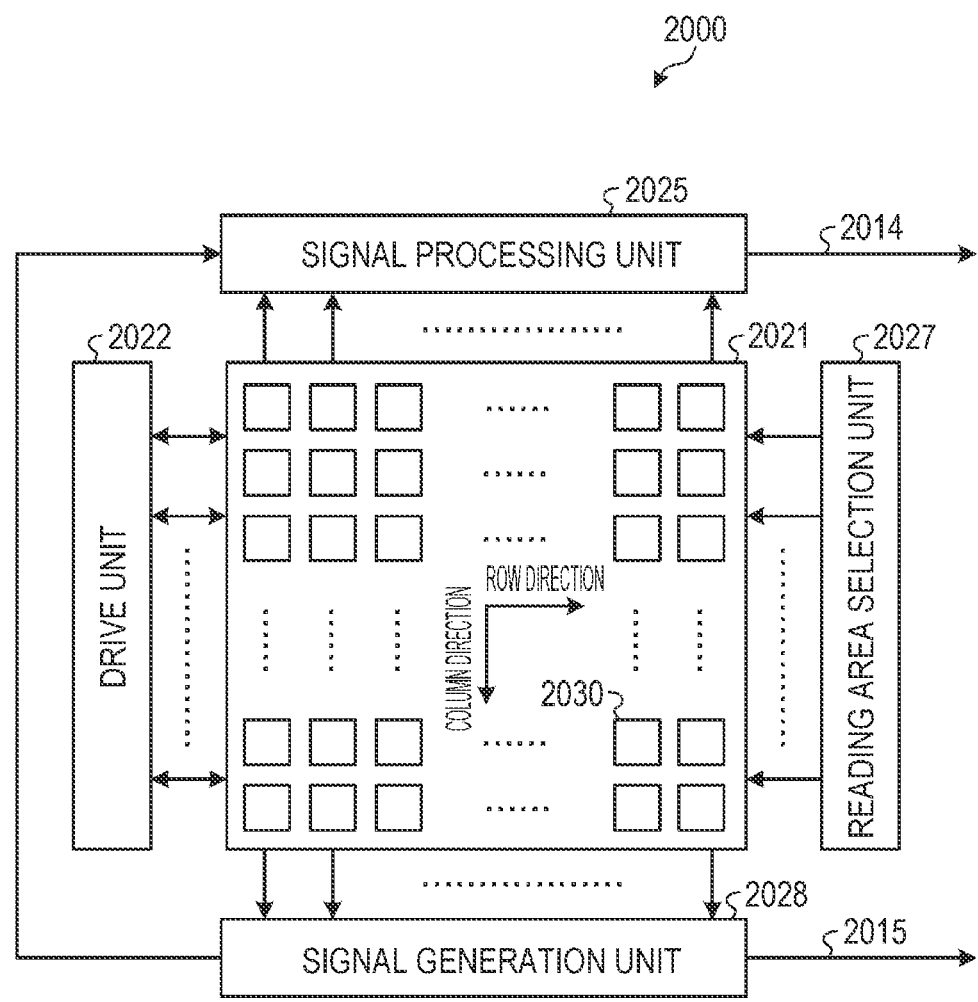
FIG. 17 is a block diagram showing an example of a configuration of an imaging device according to the second configuration example, that is, an imaging device of a scanning method that is used as an imaging device in an imaging system to which the technology according to the present disclosure is applied.

FIG. 17 is a block diagram showing an example of a configuration of an imaging device according to the second configuration example, that is, an imaging device of a scanning method, which is used as an imaging device 2000 in an imaging system to which the technology according to the present disclosure is applied.

As shown in FIG. 17, the imaging device 2000 according to the second configuration example serving as the imaging device of the present disclosure includes a pixel array unit 2021, a drive unit 2022, a signal processing unit 2025, a reading area selection unit 2027, and a signal generation unit 2028.

The pixel array unit 2021 includes the plurality of pixels 2030. The plurality of pixels 2030 outputs an output signal in response to a selection signal of the reading area selection unit 2027. The plurality of pixels 2030 each may also have a quantizer comparator in the pixel. The plurality of pixels 2030 outputs an output signal corresponding to an amount of change in intensity of light. The plurality of pixels 2030 may be two-dimensionally arranged in a matrix as shown in FIG. 17.

The drive unit 2022 drives each of the plurality of pixels 2030 to output a pixel signal generated in each pixel 2030 to the signal processing unit 2025. Note that the drive unit 2022 and the signal processing unit 2025 are circuit units for acquiring gradation information. Therefore, in a case where only event information is acquired, the drive unit 2022 and the signal processing unit 2025 may not be provided.

The reading area selection unit 2027 selects some of the plurality of pixels 2030 included in the pixel array unit 2021. Specifically, the reading area selection unit 2027 determines a selection area in response to a request from each pixel 2030 of the pixel array unit 2021. For example, the reading area selection unit 2027 selects any one or a plurality of rows among rows included in a two-dimensional matrix structure corresponding to the pixel array unit 2021. The reading area selection unit 2027 sequentially selects one or a plurality of rows in accordance with a preset period. Further, the reading area selection unit 2027 may determine the selection area in response to a request from each pixel 2030 of the pixel array unit 2021.

On the basis of output signals of pixels selected by the reading area selection unit 2027, the signal generation unit 2028 generates an event signal corresponding to an active pixel that has detected an event among the selected pixels. The event is an event in which the intensity of light changes. The active pixel is a pixel in which an amount of change in the intensity of light corresponding to the output signal exceeds or falls below a preset threshold. For example, the signal generation unit 2028 compares the output signal of the pixel with a reference signal, detects an active pixel that outputs the output signal in a case where the output signal is larger or smaller than the reference signal, and generates an event signal corresponding to the active pixel.

The signal generation unit 2028 can include, for example, a column selection circuit that arbitrates a signal entering the signal generation unit 2028. Further, the signal generation unit 2028 may output not only information regarding the active pixel that has detected the event but also information regarding an inactive pixel that has not detected the event.

Address information and timestamp information (e.g., (X, Y, T)) of the active pixel that has detected the event are output from the signal generation unit 2028 through an output line 2015. However, data output from the signal generation unit 2028 may be not only the address information and the timestamp information but also information in a frame format (e.g., (0, 0, 1, 0, . . . )).

[Distance Measurement System]

A distance measurement system according to the embodiment of the present disclosure is a system for measuring a distance from a subject by using a structured light technology. Further, the distance measurement system according to the embodiment of the present disclosure can also be used as a system that acquires a three-dimensional (3D) image, and, in this case, the distance measurement system can be referred to as a three-dimensional image acquisition system. In the structured light method, distance measurement is performed by identifying coordinates of a point image and a light source (so-called point light source) from which the point image has been projected by pattern matching.

Figure 18:
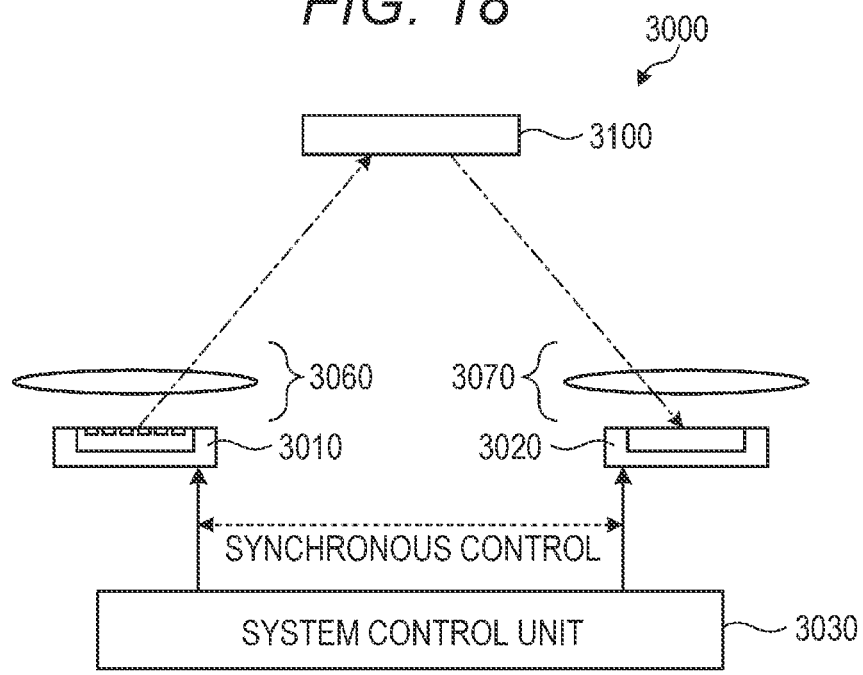
FIG. 18 is a schematic diagram showing an example of a configuration of a distance measurement system according to an embodiment of the present disclosure.
Figure 19:
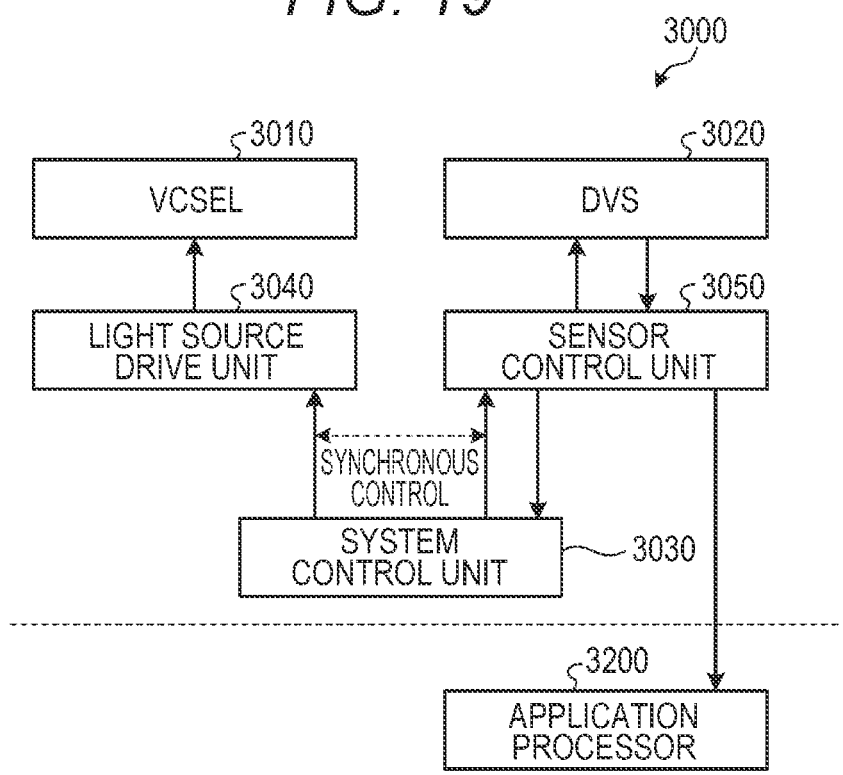
FIG. 19 is a block diagram showing an example of a circuit configuration.

FIG. 18 is a schematic diagram showing an example of a configuration of the distance measurement system according to the embodiment of the present disclosure, and FIG. 19 is a block diagram showing an example of a circuit configuration.

A distance measurement system 3000 according to the present embodiment includes a surface-emitting semiconductor laser, for example, a vertical-cavity surface-emitting laser (VCSEL) 3010 as a light source unit and includes an event detection sensor 3020 called DVS as a light receiving unit. The vertical-cavity surface-emitting laser (VCSEL) 3010 projects a predetermined pattern of light onto a subject. The distance measurement system 3000 according to the present embodiment includes not only the vertical-cavity surface-emitting laser 3010 and the event detection sensor 3020 but also a system control unit 3030, a light source drive unit 3040, a sensor control unit 3050, a light-source-side optical system 3060, and a camera-side optical system 3070.

The system control unit 3030 includes, for example, a processor (CPU), drives the vertical-cavity surface-emitting laser 3010 via the light source drive unit 3040 and drives the event detection sensor 3020 via the sensor control unit 3050. More specifically, the system control unit 3030 synchronously controls the vertical-cavity surface-emitting laser 3010 and the event detection sensor 3020.

In the distance measurement system 3000 according to the present embodiment having the above configuration, light of a predetermined pattern emitted from the vertical-cavity surface-emitting laser 3010 is projected onto a subject (measurement target) 3100 through the light-source-side optical system 3060. The projected light is reflected by the subject 3100. Then, the light reflected by the subject 3100 is incident on the event detection sensor 3020 through the camera-side optical system 3070. The event detection sensor 3020 receives the light reflected by the subject 3100 and detects, as an event, that a change in brightness of a pixel exceeds a predetermined threshold. Event information detected by the event detection sensor 3020 is supplied to an application processor 3200 outside the distance measurement system 3000. The application processor 3200 performs predetermined processing on the event information detected by the event detection sensor 3020.

Hereinabove, the embodiment of the present disclosure have been described. However, the technical scope of the present disclosure is not limited to the above-described embodiment as it is, and various modifications can be made without departing from the gist of the present disclosure. Further, components of different embodiments and modification examples may be appropriately combined.

Further, the effects described in the present specification are merely illustrative and are not limited. Further, additional effects may be obtained.

Note that the present technology can also have the following configurations.

(1)

A solid-state imaging element including:
- a plurality of first photoelectric conversion elements arranged side by side in a first region;
- a plurality of second photoelectric conversion elements arranged side by side in a second region adjacent to the first region;
- a plurality of current-voltage conversion circuits that each converts currents output from the plurality of first photoelectric conversion elements or the plurality of second photoelectric conversion elements into voltages; and
- a plurality of address event detection circuits that each detects a change in the voltages output from the plurality of current-voltage conversion circuits, in which
- at least either the current-voltage conversion circuits or the address event detection circuits connected to the second photoelectric conversion elements prevent output of signals based on the currents output from the second photoelectric conversion elements.

(2)

The solid-state imaging element according to (1), in which
the second region is provided to surround the first region.

(3)

The solid-state imaging element according to (1) or (2), in which
internal potentials of at least either the current-voltage conversion circuits or the address event detection circuits connected to the second photoelectric conversion elements are fixed.

(4)

The solid-state imaging element according to (3), in which
the current-voltage conversion circuits connected to the second photoelectric conversion elements include a plurality of transistors, and
the internal potentials of the current-voltage conversion circuits connected to the second photoelectric conversion elements are fixed by short-circuiting the plurality of transistors.

(5)

The solid-state imaging element according to (3), in which
the internal potentials of at least either the current-voltage conversion circuits or the address event detection circuits connected to the second photoelectric conversion elements are fixed by an external voltage.

(6)

The solid-state imaging element according to any one of (1) to (5), further including
 a power supply region provided outside the second region and having power supply wiring and ground wiring.

(7)

The solid-state imaging element according to (6), in which
 an internal potential of the power supply region is fixed.

(8)

The solid-state imaging element according to (6) or (7), in which
 the power supply region is electrically integrated.

(9)

An imaging device including:
a solid-state imaging element;
an optical system that captures incident light from a subject and forms an image on an imaging surface of the solid-state imaging element; and
a control unit that controls the solid-state imaging element, in which
the solid-state imaging element includes
 a plurality of first photoelectric conversion elements arranged side by side in a first region,
 a plurality of second photoelectric conversion elements arranged side by side in a second region adjacent to the first region,
 a plurality of current-voltage conversion circuits that each converts currents output from the plurality of first photoelectric conversion elements or the plurality of second photoelectric conversion elements into voltages, and
 a plurality of address event detection circuits that each detects a change in the voltages output from the plurality of current-voltage conversion circuits, and
 at least either the current-voltage conversion circuits or the address event detection circuits prevent output of signals based on the currents output from the plurality of second photoelectric conversion elements.

The imaging device according to (9), in which
the second region is provided to surround the first region.

(11)

The imaging device according to (9) or (10), in which
internal potentials of at least either the current-voltage conversion circuits or the address event detection circuits connected to the second photoelectric conversion elements are fixed.

(12)

The imaging device according to (11), in which
the current-voltage conversion circuits connected to the second photoelectric conversion elements include a plurality of transistors, and
the internal potentials of the current-voltage conversion circuits connected to the second photoelectric conversion elements are fixed by short-circuiting the plurality of transistors.

(13)

The imaging device according to (11), in which
the internal potentials of at least either the current-voltage conversion circuits or the address event detection circuits connected to the second photoelectric conversion elements are fixed by an external voltage.

(14)

The imaging device according to any one of (9) to (13), further including
 a power supply region provided outside the second region and having power supply wiring and ground wiring.

The imaging device according to (14), in which
an internal potential of the power supply region is fixed.

(16)

The imaging device according to (14) or (15), in which
the power supply region is electrically integrated.

REFERENCE SIGNS LIST

100 Imaging device
110 Imaging lens (example of optical system)
130 Control unit
200 Solid-state imaging element
231, 231A Address event detection circuit
310 Effective pixel
310A Dummy pixel
311 Photodiode (example of first photoelectric conversion element)
311A Photodiode (example of second photoelectric conversion element)
320, 320A Current-voltage conversion circuit
421 Ground wiring
422, 423 Power supply wiring
R1 Effective pixel region (example of first region)
R2 Dummy pixel region (example of second region)
R3 Power supply region

What is claimed is:

1. A solid-state imaging element, comprising:
a plurality of first photoelectric conversion elements arranged side by side in a first region;
a plurality of second photoelectric conversion elements arranged side by side in a second region adjacent to the first region;
a plurality of current-voltage conversion circuits that each converts currents output from the plurality of first photoelectric conversion elements or the plurality of second photoelectric conversion elements into voltages; and
a plurality of address event detection circuits that each detects a change in the voltages output from the plurality of current-voltage conversion circuits,
wherein at least either the current-voltage conversion circuits or the address event detection circuits connected to the second photoelectric conversion elements prevent output of signals based on the currents output from the second photoelectric conversion elements,
wherein internal potentials of at least either the current-voltage conversion circuits or the address event detection circuits connected to the second photoelectric conversion elements are fixed,
wherein the current-voltage conversion circuits connected to the second photoelectric conversion elements include a plurality of transistors, and
wherein the internal potentials of the current-voltage conversion circuits connected to the second photoelectric conversion elements are fixed by short-circuiting the plurality of transistors.

2. The solid-state imaging element according to claim 1, wherein the second region is provided to surround the first region.

3. The solid-state imaging element according to claim 1, wherein the internal potentials of at least either the current-voltage conversion circuits or the address event detection circuits connected to the second photoelectric conversion elements are fixed by an external voltage.

4. The solid-state imaging element according to claim 1, further comprising a power supply region provided outside the second region and having power supply wiring and ground wiring.

5. The solid-state imaging element according to claim 4, wherein an internal potential of the power supply region is fixed.

6. The solid-state imaging element according to claim 4, wherein the power supply region is electrically integrated.

7. The solid-state imaging element according to claim 4, wherein the power supply region surrounds four sides of the second region.

8. The solid-state imaging element according to claim 4, wherein the power supply region surrounds two sides of the second region.

9. The solid-state imaging element according to claim 4, wherein the power supply region surrounds one side of the second region.

10. The solid-state imaging element according to claim 4, further comprising a pad region provided around the power supply region, wherein the pad region includes a contact hole and a bonding pad.

11. An imaging device, comprising:
a solid-state imaging element;
an optical system that captures incident light from a subject and forms an image on an imaging surface of the solid-state imaging element; and
a control unit that controls the solid-state imaging element,
wherein the solid-state imaging element includes;
a plurality of first photoelectric conversion elements arranged side by side in a first region;
a plurality of second photoelectric conversion elements arranged side by side in a second region adjacent to the first region;
a plurality of current-voltage conversion circuits that each converts currents output from the plurality of first photoelectric conversion elements or the plurality of second photoelectric conversion elements into voltages; and
a plurality of address event detection circuits that each detects a change in the voltages output from the plurality of current-voltage conversion circuits;
wherein at least either the current-voltage conversion circuits or the address event detection circuits prevent output of signals based on the currents output from the plurality of second photoelectric conversion elements,
wherein internal potentials of at least either the current-voltage conversion circuits or the address event detection circuits connected to the second photoelectric conversion elements are fixed,
wherein the current-voltage conversion circuits connected to the second photoelectric conversion elements include a plurality of transistors, and
wherein the internal potentials of the current-voltage conversion circuits connected to the second photoelectric conversion elements are fixed by short-circuiting the plurality of transistors.

12. The imaging device according to claim 11, wherein the second region is provided to surround the first region.

13. The imaging device according to claim 11, wherein the internal potentials of at least either the current-voltage conversion circuits or the address event detection circuits connected to the second photoelectric conversion elements are fixed by an external voltage.

14. The imaging device according to claim 11, further comprising a power supply region provided outside the second region and having power supply wiring and ground wiring.

15. The imaging device according to claim 14, wherein an internal potential of the power supply region is fixed.

16. The imaging device according to claim 14, wherein the power supply region is electrically integrated.

17. The imaging device according to claim 14, wherein the power supply region surrounds four sides of the second region.

18. The imaging device according to claim 14, wherein the power supply region surrounds two sides of the second region.

19. The imaging device according to claim 14, wherein the power supply region surrounds one side of the second region.

20. The imaging device according to claim 14, further comprising a pad region provided around the power supply region, wherein the pad region includes a contact hole and a bonding pad.

* * * * *